(12) United States Patent
Lv et al.

(10) Patent No.: US 12,033,994 B2
(45) Date of Patent: Jul. 9, 2024

(54) DISPLAY PANEL AND PREPARATION METHOD THEREOF

(71) Applicant: BOE Technology Group Co., Ltd., Beijing (CN)

(72) Inventors: Zhijun Lv, Beijing (CN); Feng Zhang, Beijing (CN); Liwen Dong, Beijing (CN); Wenqu Liu, Beijing (CN); Xiaoxin Song, Beijing (CN); Zhao Cui, Beijing (CN); Detian Meng, Beijing (CN); Libo Wang, Beijing (CN); Dongfei Hou, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 121 days.

(21) Appl. No.: 17/204,562

(22) Filed: Mar. 17, 2021

(65) Prior Publication Data
US 2022/0068899 A1    Mar. 3, 2022

(30) Foreign Application Priority Data

Aug. 25, 2020 (CN) .......................... 202010863186.9

(51) Int. Cl.
| | |
|---|---|
| *H01L 25/16* | (2023.01) |
| *H01L 23/00* | (2006.01) |
| *H01L 27/12* | (2006.01) |
| *H01L 33/62* | (2010.01) |

(52) U.S. Cl.
CPC ............ *H01L 25/167* (2013.01); *H01L 24/32* (2013.01); *H01L 24/83* (2013.01); *H01L 24/98* (2013.01); *H01L 27/1262* (2013.01); *H01L 33/62* (2013.01); *H01L 2224/32145* (2013.01); *H01L 2224/83005* (2013.01); *H01L 2224/83048* (2013.01); *H01L 2224/838* (2013.01); *H01L 2924/12041* (2013.01); *H01L 2933/0066* (2013.01)

(58) Field of Classification Search
None
See application file for complete search history.

(56) References Cited

U.S. PATENT DOCUMENTS

| | | | | |
|---|---|---|---|---|
| 2017/0179092 | A1* | 6/2017 | Sasaki | ............... H10K 59/70 |
| 2018/0122836 | A1* | 5/2018 | Kang | .................. H01L 33/54 |
| 2018/0122837 | A1* | 5/2018 | Kang | ................. H01L 27/124 |

(Continued)

*Primary Examiner* — Erik T. K. Peterson
*Assistant Examiner* — Christopher A. Schodde
(74) *Attorney, Agent, or Firm* — ArentFox Schiff LLP; Michael Fainberg

(57) ABSTRACT

The present application discloses a display panel and a preparation method thereof. The display panel includes a base substrate provided with a circuit area and a light-emitting area; a driving circuit located in the circuit area of the base substrate; an organic insulating layer covering the light-emitting area of the base substrate; a light-emitting element embedded in the organic insulating layer, where an overlap area between the orthographic projection of the light-emitting element on the base substrate and the orthographic projection of the driving circuit on the base substrate is 0; and a first lapping electrode located on the side, facing away from the base substrate, of the light-emitting element, where the light-emitting element is electrically connected to the driving circuit through the first lapping electrode.

14 Claims, 6 Drawing Sheets

(56) References Cited

U.S. PATENT DOCUMENTS

| | | | |
|---|---|---|---|
| 2019/0181301 A1* | 6/2019 | Kim | H01L 33/62 |
| 2020/0135971 A1* | 4/2020 | Beak | H10K 59/173 |
| 2020/0201393 A1* | 6/2020 | Ahn | G06F 1/1652 |
| 2021/0013186 A1* | 1/2021 | Chen | H01L 25/0753 |
| 2021/0134191 A1* | 5/2021 | Jung | H01L 25/167 |
| 2022/0131059 A1* | 4/2022 | Yamada | H01L 33/005 |

* cited by examiner

DISPLAY PANEL AND PREPARATION METHOD THEREOF

CROSS REFERENCE TO RELATED APPLICATIONS

The present application is based on and claims priority under 35 U.S.C. 119 to a Chinese Patent Application No. 202010863186.9 filed on Aug. 25, 2020, in the China National Intellectual Property Administration, the entire content of which is incorporated into the disclosure by reference.

FIELD

The present application relates to the field of display, in particular to a display panel and a preparation method thereof.

BACKGROUND

The technology of small-size light-emitting devices is currently facing considerable technical challenges, among which the mass transfer technology is currently the most difficult key process. After light-emitting elements are subjected to the photolithography process, bare chip particles of the light-emitting elements need to be transferred from an original substrate to a driving substrate, and lamp bead electrodes are directly connected to the substrates. Due to the very large amount of lamp beads transferred each time, a very high level of stability and accuracy is required in the transfer process.

At present, the eutectic welding technology is widely used among the micro-components transfer technology for light-emitting element, which has the advantages such as low voidage and good heat dissipation, and is especially suitable for high-frequency components with high temperature requirements. Eutectic welding is generally carried out in a vacuum or inert gas environment, and aims to prevent oxidation by air during welding. A eutectic furnace is special equipment developed based on the eutectic principle, and completes packaging of chips in a vacuum or inert protective gas environment in accordance with the requirements of the eutectic process curve of different welding alloy materials. Existing eutectic furnaces can provide a vacuum environment or a controllable atmosphere (nitrogen, mixed gas of nitrogen and formic acid, and the like) during eutectic welding without flux, can set the process curve according to the eutectic characteristics of welding objects and precisely control the eutectic environment in the furnaces, including temperature and time, vacuum degree, charging gas flow and time.

SUMMARY

An embodiment of the present disclosure provides a display panel, including:
  a base substrate provided with a circuit area and a light-emitting area;
  a driving circuit located in the circuit area of the base substrate;
  an organic insulating layer covering the light-emitting area of the base substrate;
  a light-emitting element embedded in the organic insulating layer, where an overlap area between the orthographic projection of the light-emitting element on the base substrate and the orthographic projection of the driving circuit on the base substrate is 0; and
  a first lapping electrode located on the side, facing away from the base substrate, of the light-emitting element, where the light-emitting element is electrically connected to the driving circuit through the first lapping electrode.

In some embodiments, according to the above-mentioned display panel provided in the embodiments of the present application, the organic insulating layer further covers the circuit area, and the display panel further includes an interlayer insulating layer located between a film layer on which the first lapping electrode is located and the light-emitting element;
  the driving circuit includes an active layer, a gate insulating layer and a gate sequentially stacked on the base substrate, the light-emitting element is electrically connected to the first lapping electrode through at least one first via hole penetrating through the interlayer insulating layer, and
  the first lapping electrode is electrically connected to the active layer through a second via hole penetrating through the interlayer insulating layer and the organic insulating layer.

In some embodiments, the above-mentioned display panel provided in the embodiments of the present application further includes: a buffer layer located between the base substrate and the driving circuit, a common electrode layer located between the buffer layer and the base substrate, and a light-shielding metal layer located between the common electrode layer and the base substrate;
  the display panel further includes: a second lapping electrode arranged on the same layer as the first lapping electrode;
  the side, facing away from the base substrate, of the light-emitting element includes a first electrode and a second electrode,
  the first electrode is electrically connected to the first lapping electrode through one of the at least one first via hole penetrating through the interlayer insulating layer,
  the second electrode is electrically connected to the second lapping electrode through another one of the at least one first via hole penetrating through the interlayer insulating layer, and
  the second lapping electrode is electrically connected to the common electrode layer through a third via hole sequentially penetrating through the interlayer insulating layer, the organic insulating layer and the buffer layer.

In some embodiments, according to the above-mentioned display panel provided in the embodiments of the present application, the display panel further includes:
  a passivation layer located on the side, facing away from the base substrate, of the first lapping electrode,
  a pixel electrode located on the side, facing away from the base substrate, of the passivation layer, where the pixel electrode is electrically connected to the second lapping electrode through a fourth via hole penetrating through the passivation layer, and
  a package structure located on the side, facing away from the base substrate, of the pixel electrode.

In some embodiments, according to the above-mentioned display panel provided in the embodiments of the present application, the thickness of the organic insulating layer is greater than half of the thickness of the light-emitting element.

In some embodiments, according to the above-mentioned display panel provided in the embodiments of the present application, the interlayer insulating layer is made of an inorganic material or an organic material.

In some embodiments, according to the above-mentioned display panel provided in the embodiments of the present application, the light-emitting element has light emitting colors including red, green and blue.

Correspondingly, an embodiment of the present application further provides a preparation method of a display panel, including:

forming a driving circuit in a circuit area of a base substrate;

forming an organic insulating layer covering a light-emitting area on the base substrate;

adhering a light-emitting element to a box alignment substrate through pyrolysis adhesives;

aligning and bonding the box alignment substrate with the light-emitting element and the base substrate on which the organic insulating layer is formed through an aligning device to embed the light-emitting element within the organic insulating layer; where an overlap area between the orthographic projection of the light-emitting element on the base substrate and the orthographic projection of the driving circuit on the base substrate is 0;

peeling off the pyrolysis adhesives;

forming a first lapping electrode on the side, facing away from the base substrate, of the light-emitting element; where the light-emitting element is electrically connected to the driving circuit through the first lapping electrode.

In some embodiments, according to the above-mentioned preparation method provided in the embodiments of the present application, after forming the organic insulating layer, the method further includes: pre-curing the organic insulating layer with a pre-curing temperature being from 100° C. to 120° C., and a time being from 90 s to 150 s.

In some embodiments, according to the above-mentioned preparation method provided in the embodiments of the present application, the peeling off the pyrolysis adhesives includes:

curing the organic insulating layer with a curing temperature being from 220° C. to 250° C., and a time being from 30 min to 60 min; and leaving the pyrolysis adhesives to lose adhesion and detach from the light emitting element.

In some embodiments, according to the above-mentioned preparation method provided in the embodiments of the present application, the organic insulating layer further covers the circuit area, the forming the driving circuit in the circuit area of the base substrate includes:

forming an active layer, a gate insulating layer and a gate on the base substrate in a stacked mode sequentially; and before forming the first lapping electrode on the side, facing away from the base substrate, of the light-emitting element, the method further includes:

forming an interlayer insulating layer on the side, facing away from the base substrate, of the light-emitting element; and etching the interlayer insulating layer and the organic insulating layer to electrically connect the light-emitting element to the first lapping electrode through at least one first via hole penetrating through the interlayer insulating layer, and to electrically connect the first lapping electrode to the active layer through a second via hole penetrating through the interlayer insulating layer and the organic insulating layer.

In some embodiments, in the above-mentioned preparation method provided in the embodiments of the present application, before forming the driving circuit in the circuit area of the base substrate, the method includes:

forming a light-shielding metal layer, a common electrode layer and a buffer layer on the base substrate in a stacked mode sequentially;

after forming the interlayer insulating layer on the side, facing away from the base substrate, of the light-emitting element, the method further includes:

forming a second lapping electrode arranged on the same layer as the first lapping electrode on the side, facing away from the base substrate, of the light-emitting element; and etching the interlayer insulating layer and the organic insulating layer to electrically connect the light-emitting element to the second lapping electrode through another one of the at least one first via hole penetrating through the interlayer insulating layer, and to electrically connect the second lapping electrode to the common electrode layer through a third via hole sequentially penetrating through the interlayer insulating layer, the organic insulating layer and the buffer layer.

In some embodiments, the above-mentioned preparation method provided in the embodiments of the present application further includes:

forming a pixel electrode on the side, facing away from the base substrate, of the first lapping electrode; and forming a package structure on the side, facing away from the base substrate, of the pixel electrode; and before forming the pixel electrode on the side, facing away from the base substrate, of the first lapping electrode, the method further includes:

forming a passivation layer on the side, facing away from the base substrate, of the first lapping electrode, and patterning the passivation layer to form a fourth via hole penetrating through the passivation layer to electrically connect the pixel electrode to the second lapping electrode through the fourth via hole.

DETAILED DESCRIPTION OF THE EMBODIMENTS

In order to make the purpose, technical solutions and advantages of the present application clearer, the present application will be further described in detail below in conjunction with the accompanying drawings. Obviously, the described embodiments are only a part of the embodiments of the present application, rather than all of them. Based on the embodiments in the present application, all other embodiments obtained by those of ordinary skill in the art without creative work shall fall within the protection scope of the present application.

The shapes and sizes of components in the figures do not reflect the true proportions, and are only intended to illustrate the content of the present application.

Figure 1:
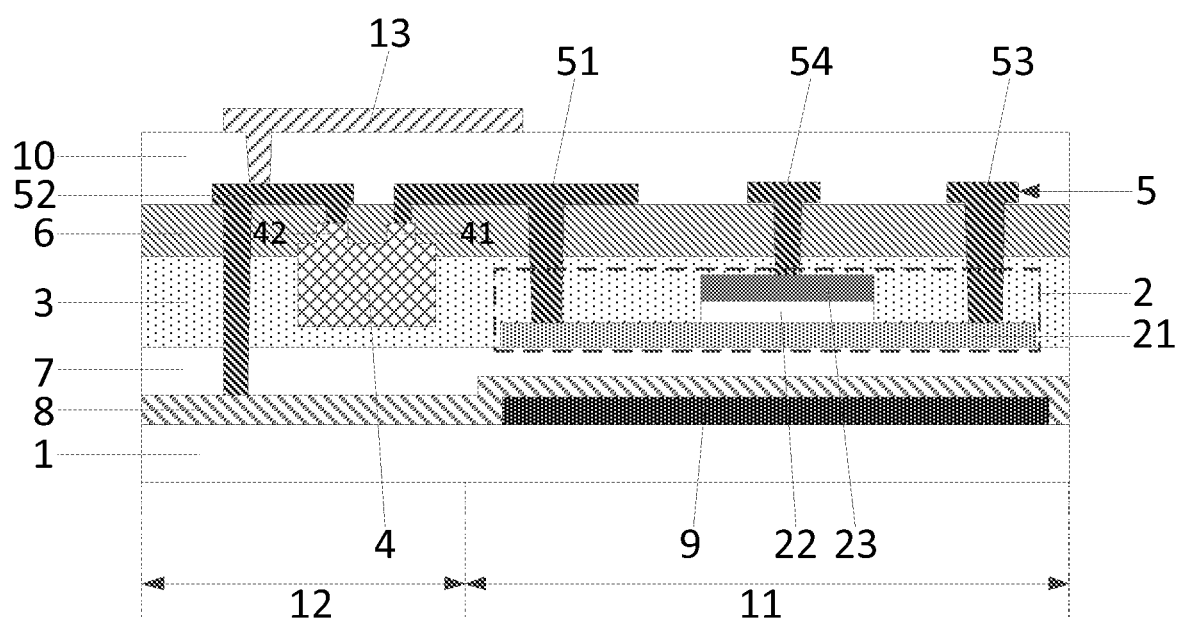
FIG. 1 is a schematic diagram of a cross-sectional structure of a display panel provided by an embodiment of the present application.

An embodiment of the present application provides a display panel, as shown in FIG. 1, including:
- a base substrate 1 provided with a circuit area 11 and a light-emitting area 12; where a display panel generally includes a plurality of sub-pixels, and FIG. 1 only illustrates a schematic cross-sectional view of one of the sub-pixels;
- a driving circuit 2 located in the circuit area 11 of the base substrate 1;
- an organic insulating layer 3 covering the light-emitting area 12 of the base substrate 1;
- a light-emitting element 4 embedded in the organic insulating layer 3, where the orthographic projection of the light-emitting element 4 on the base substrate 1 and the orthographic projection of the driving circuit 2 on the base substrate 1 do not overlap; and
- a first lapping electrode 51 located on the side, facing away from the base substrate 1, of the light-emitting element 4, where the light-emitting element 4 is electrically connected to the driving circuit 2 through the first lapping electrode 51.

In the above-mentioned display panel provided by the embodiments of the present application, since the organic insulating layer is generally made of a resin material, the resin material can flow before being completely cured. Therefore, the resin material may be pre-cured to prevent it from flowing and to ensure that it has certain flexibility, thus the light-emitting element can be embedded in the organic insulating layer by means of alignment bonding using aligning device. Therefore, it is not necessary to adopt the eutectic welding technology in the related technology to transfer bare chip particles of the light-emitting element from an original substrate to the driving substrate. Therefore, the present application provides a simple, practical and economical light-emitting element mass transfer technology with high efficiency, yield and transfer precision.

It should be noted that the light-emitting element 4 includes a first electrode 41 and a second electrode 42 (which will be described later). The above-mentioned light-emitting element 4 is embedded in the organic insulating layer 3, which means that a part of the light-emitting element 4 is embedded in the organic insulating layer 3, and the first electrode 41 and the second electrode 42 are exposed out of the organic insulating layer 3 to realize subsequent electrode lapping.

In some embodiments, in the above-mentioned display panel provided by the embodiments of the present application, the light-emitting element may be a Micro LED. Since the size of the Micro LED is small, the pixel resolution of the display panel can be increased. The size of Micro LED is generally less than 100 μm. Certainly, the light-emitting element may also be other light-emitting elements such as Mini LED, which is not limited in the present application. When the light-emitting element is a Mini LED, the size of the Mini LED ranges from 100 μm to 200 μm.

It should be noted that the light-emitting element being a Micro LED is taken as an example for description in the embodiment of the present application, and the Micro LED below represents a light-emitting element.

In some embodiments, the organic insulating layer may be made of a silicon-based resin material which is a flat non-photosensitive resin material, and the use of a silicon-based resin material for the organic insulating layer can achieve the effect of flat bottom structure changes on the Micro LED. The organic insulating layer may also be made of a photosensitive resin material for covering and protecting the Micro LED and exposing chip electrodes with openings.

In some embodiments, the thickness of the organic insulating layer may be greater than half of the thickness of the light-emitting element (Micro LED), which can ensure that the Micro LED can be effectively fixed in the organic insulating layer when the Micro LED is subsequently bonded. In some embodiments, before the Micro LED is embedded in the organic insulating layer, only the organic insulating layer needs to be pre-cured which aims to ensure that the Micro LED can be easily pressed into the organic insulating layer of a drive backplane when the Micro LED substrate is aligned with aligning device.

It should be noted that the size of the first electrode 41 and the second electrode 42 of the light-emitting element 4 is negligible relative to the size of the light-emitting element 4, thus the thickness of the light-emitting element 4 may be the thickness in the direction from the base substrate 1 to the organic insulating layer 3 when an electrode is not included, or may be the thickness in the direction from the base substrate 1 to the organic insulating layer 3 when an electrode is included.

In some embodiments, the thickness of the organic insulating layer may be determined according to the size of the light-emitting element. For example, when the thickness of the light-emitting element ranges from 6 to 8 μm, the thickness of the organic insulating layer may range from 3 to 5 μm.

In some embodiments, in the above-mentioned display panel provided by the embodiments of the present application, as shown in FIG. 1, the organic insulating layer 3 further covers the circuit area 11. Further, the organic insulating layer 3 may be formed on the side, facing away from the base substrate 1, of the driving circuit 2 on the whole surface;

generally, the thickness of a conventional Micro LED ranges from 6 to 8 μm, and an interlayer insulating layer 6 needs to be added to cover and protect the light-emitting element 4. The thickness of the interlayer insulating layer 6 should not be too thick as long as it can match the thickness of the organic insulating layer 3 to cover the light-emitting element 4 and the electrodes (namely the first electrode 41 and the second electrode 42, which will be described later) of the light-emitting element 4, so that the etching time during subsequent etching is reduced, and the process efficiency is improved. Thus, in some embodiments, the display panel further includes an interlayer insulating layer 6 located between a film layer on which the first lapping electrode 51 is located and the light-emitting element 4; and the driving circuit 2 includes an active layer 21, a gate insulating layer 22 and a gate 23 which are sequentially stacked on the base substrate 1, the light-emitting element 4 is electrically connected to the first lapping electrode 51 through a via hole penetrating through the interlayer insulating layer 6, the first lapping electrode 51 is electrically connected to the active layer 21 through a via hole penetrating through the interlayer insulating layer 6 and the organic insulating layer 3.

It should be noted that the embodiment of the present application are described by taking a top-gate transistor as the driving circuit as an example, a bottom-gate transistor may be adopted as the driving circuit as well, the difference is that the shape of the gate insulating layer of the top-gate transistor is the same as the shape of a gate (in order to lap a source-drain metal layer formed subsequently with the active layer), while in the bottom-gate transistor, the active layer is located above the gate insulating layer, so that the gate insulating layer does not need to be etched and can be a whole surface structure.

In some embodiments, in the above-mentioned display panel provided in the embodiments of the present application, the interlayer insulating layer may be made of an inorganic material or an organic material. Since the inorganic layer is generally thin, when the part, exposed out of the organic insulating layer, of the light-emitting element is thin, an inorganic material can be selected to prepare the interlayer insulating layer. When the part, exposed out of the organic insulating layer, of the light-emitting element is thick, the organic material can be selected to prepare the interlayer insulating layer, and a silicon-based resin material with good flatness may be adopted as the organic material, which can also enhance the direct adhesion between the interlayer insulating layer and the organic insulating layer and improve the performance of the display panel.

In some embodiments, a film layer on which the first lapping electrode 51 is located is a source-drain metal layer 5. The source-drain metal layer 5 further includes a third lapping electrode 53 and a fourth lapping electrode 54. The first lapping electrode 51 and the third lapping electrode 53 are electrically connected to the active layer 21, the parts, corresponding to the first lapping electrode 51 and the third lapping electrode 53, of the active layer 21 correspond to a source and a drain, and the fourth lapping electrode 54 is electrically connected to the gate 23.

In some embodiments, the above-mentioned display panel provided by the embodiments of the present application, as shown in FIG. 1, further includes: a buffer layer 7 located between the base substrate 1 and the driving circuit 2, a common electrode layer 8 located between the buffer layer 7 and the base substrate 1, and a light-shielding metal layer 9 located between the common electrode layer 8 and the base substrate 1; wherein, in order to prevent the active layer 21 from being irradiated by external ambient light and destroy the performance, the orthographic projection of the light-shielding metal layer 9 on the base substrate 1 covers the orthographic projection of the active layer 21 on the base substrate 1;

the display panel further includes: a second lapping electrode 52 arranged on the same layer as the first lapping electrode 51; and the side, facing away from the base substrate 1, of the light-emitting element 4 includes a first electrode 41 and a second electrode 42, the first electrode 41 is electrically connected to the first lapping electrode 51, the second electrode 42 is electrically connected to the second lapping electrode 52 through a via hole penetrating through the interlayer insulating layer 6, and the second lapping electrode 52 is electrically connected to the common electrode layer 8 through a via hole sequentially penetrating through the interlayer insulating layer 6, the organic insulating layer 3 and the buffer layer 7.

In some embodiments, when the light-emitting element 4 emits light, a driving voltage is input to the first electrode 41 of the light-emitting element 4 through the driving circuit 2, and a common voltage is input to the second electrode 42 of the light-emitting element 4 through the common electrode layer 8 to drive the light-emitting element 4 to emit light, and the specific light-emitting principle is the same as that of the prior art and will not be described in detail herein.

In some embodiments, the common electrode layer 8 is made of a transparent conductive material, such as Indium Tin Oxide (ITO).

In some embodiments, the above-mentioned display panel provided by the embodiments of the present application, as shown in FIG. 1, further includes: a passivation layer 10 located on the side, facing away from the base substrate 1, of the first lapping electrode 51, a pixel electrode 13 located on the side, facing away from the base substrate 1, of the passivation layer 10, and a package structure (not shown) located on the side, facing away from the base substrate 1, of the pixel electrode 13; and the pixel electrode 13 is electrically connected to the second lapping electrode 52 through a via hole penetrating through the passivation layer 10.

In some embodiments, the pixel electrode 13 is made of a transparent conductive material, such as ITO.

In specific implementation, the above-mentioned display panel provided by the embodiment of the present application may also include other functional film layers well known to those skilled in the art, which will not be described in detail herein.

In some embodiments, according to the above-mentioned display panel provided in the embodiments of the present application, the light-emitting color of the light-emitting element can include red, green and blue. That is, for a plurality of sub-pixels included in the above-mentioned display panel, there are a plurality of light-emitting elements, and the plurality of light-emitting elements include a red light-emitting element, a green light-emitting element and a blue light-emitting element so as to achieve full-color display.

Figure 2:
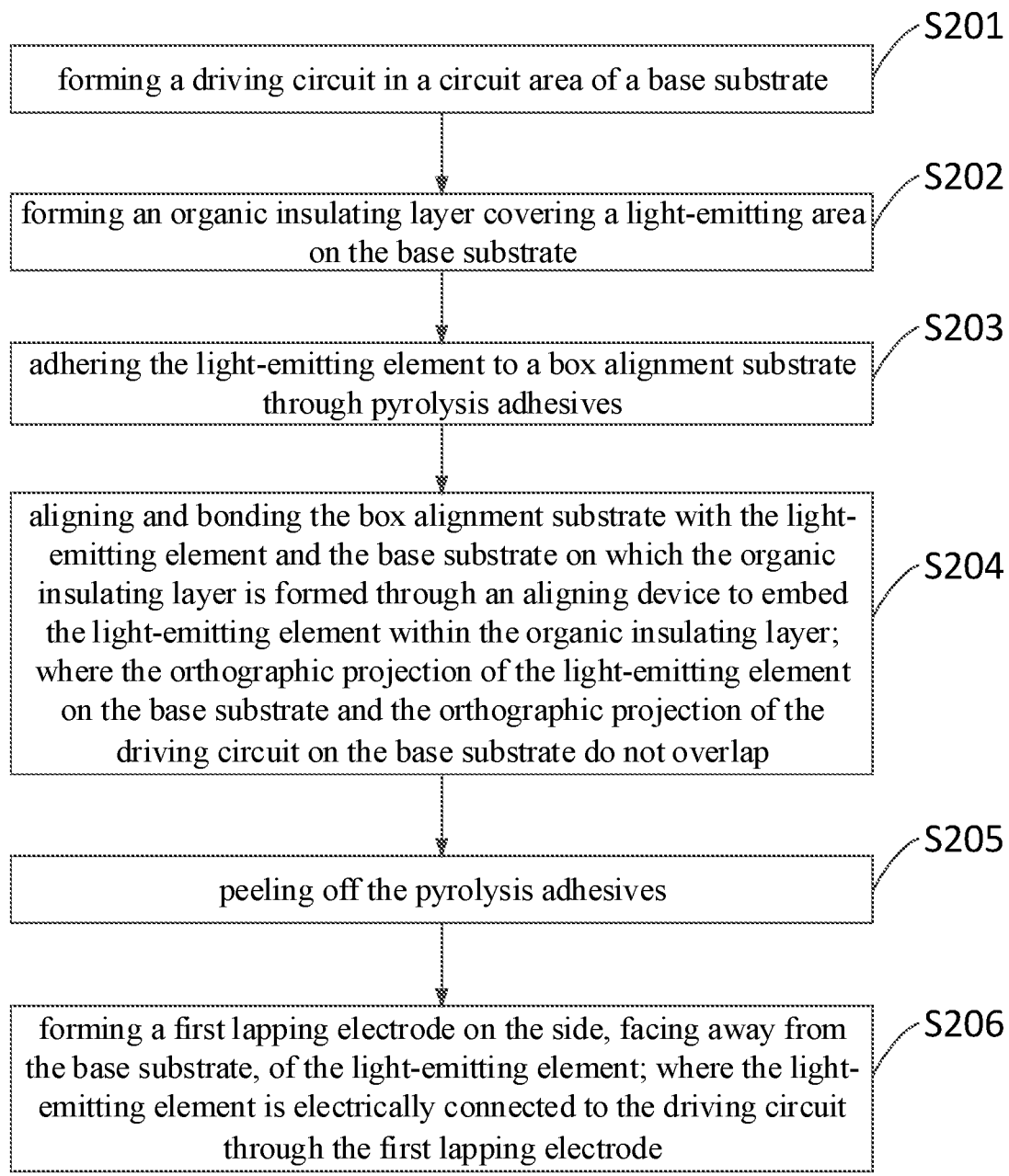
FIG. 2 is a first flow diagram of a preparation method of a display panel provided by an embodiment of the present application.

Based on the same inventive concept, an embodiment of the present application further provides a preparation method of the above-mentioned display panel, as shown in FIG. 2, the preparation method includes as follows.

Figure 3A:
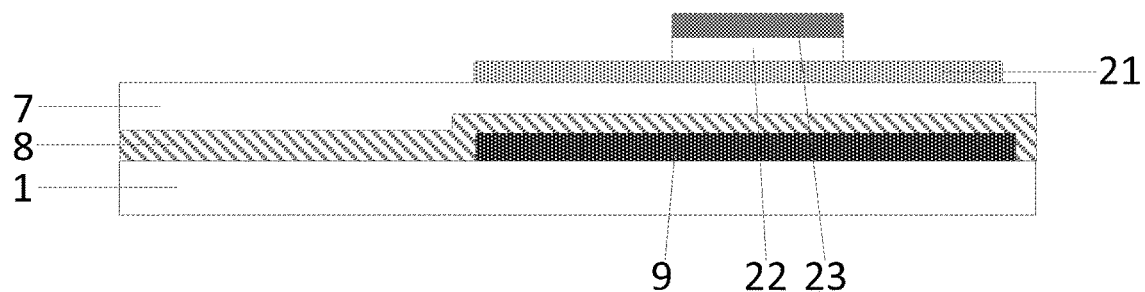
FIG. 3A is a first structural schematic diagram of a display panel after performing a preparation method of the display panel provided by an embodiment of the present application.

S201, forming a driving circuit in a circuit area of a base substrate;
  in some embodiments, as shown in FIG. 3A, a light-shielding metal layer 9, a common electrode layer 8, a buffer layer 7, a gate 21, a gate insulating layer 22 and a gate 23 are sequentially formed on the base substrate 1 in a stacked mode.

Figure 3B:
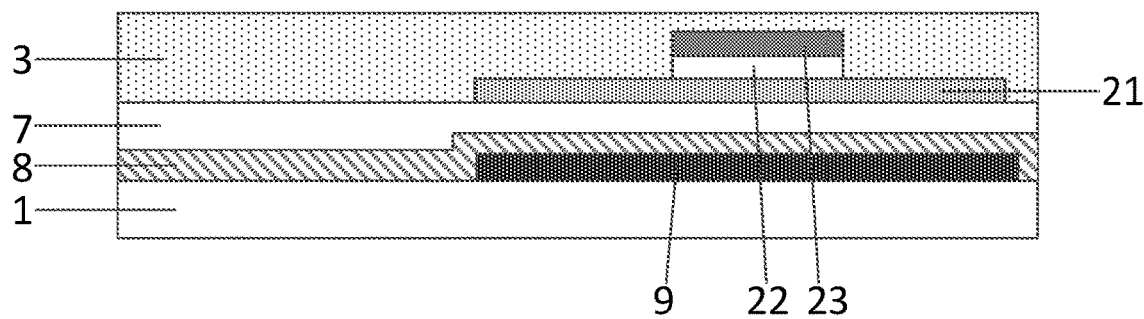
FIG. 3B is a second structural schematic diagram of a display panel after performing a preparation method of the display panel provided by an embodiment of the present application.

S202, forming an organic insulating layer covering a light-emitting area on the base substrate;
  in some embodiments, as shown in FIG. 3B, an organic insulating layer 3 is formed on the base substrate 1 with the gate 23. To form the organic insulating layer in the step, the base substrate on which the gate is formed is coated with a resin material at first. Due to the fluidity of the resin material, in some embodiments, the resin material is pre-cured firstly, that is, the resin material is pre-baked after coating, and the resin material does not flow after the treatment, which facilitates the subsequent exposure and other processes not to contaminate the equipment. After coating the nearly liquid resin material, the pre-curing treatment is performed, groups therein are not completely cross-linked, and the overall film layer is not dense, which facilitates the subsequent bonding and embedding of the light-emitting element 4 into the organic insulating layer 3.

Figure 3C:
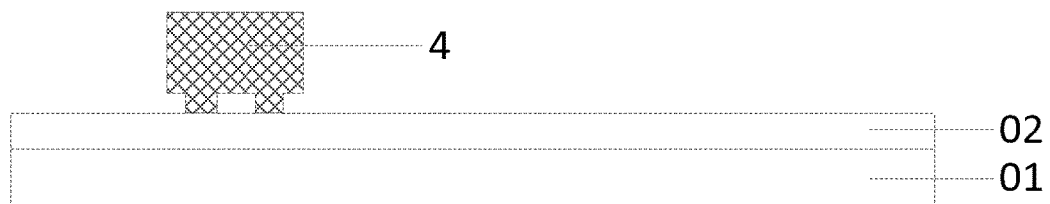
FIG. 3C is a third structural schematic diagram of a display panel after performing a preparation method of the display panel provided by an embodiment of the present application.

S203, adhering the light-emitting element to a box alignment substrate through pyrolysis adhesives;
  in some embodiments, as shown in FIG. 3C, the light-emitting element 4 is adhered to the box alignment substrate 01 by the pyrolysis adhesives 02, where the pyrolysis adhesives 02 will gradually lose adhesion at a certain high temperature, and be detached from the light-emitting element 4.

Figure 3D:
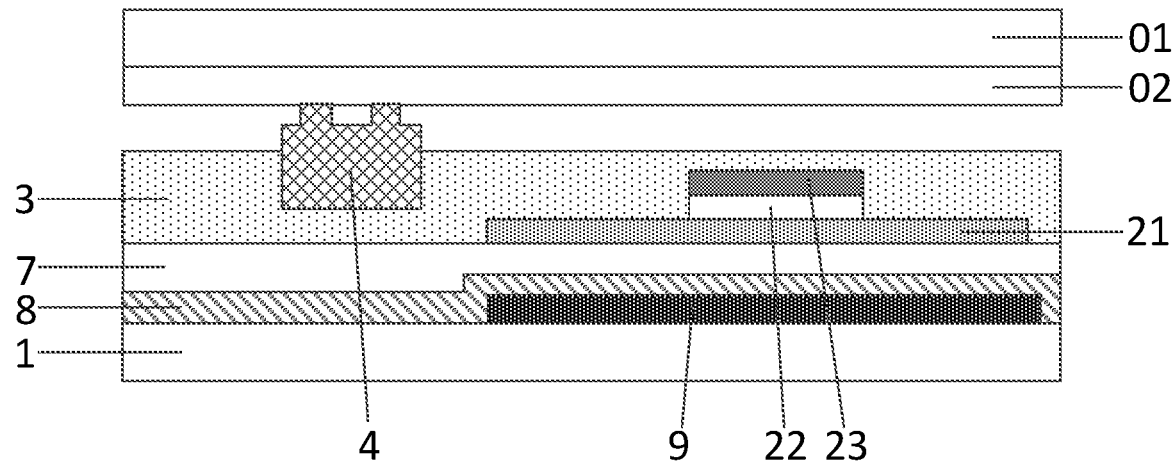
FIG. 3D is a fourth structural schematic diagram of a display panel after performing a preparation method of the display panel provided by an embodiment of the present application.

S204, aligning and bonding the box alignment substrate with the light-emitting element and the base substrate on which the organic insulating layer is formed through an aligning device to embed the light-emitting element within the organic insulating layer; where the orthographic projection of the light-emitting element on the base substrate and the orthographic projection of the driving circuit on the base substrate do not overlap;
  in some embodiments, as shown in FIG. 3D, the box alignment substrate 01 with the light-emitting element 4 and the base substrate 1 on which the organic insulating layer 3 is formed are aligned and bonded through the aligning device, so that the light-emitting element 4 can be embedded in the organic insulating layer 3. The aligning device may be One drop Filling (ODF) aligning device, the aligning device is provided with suction cups on the top and bottom, the upper suction cups suck the box alignment substrate 01, and the lower suction cups suck the base substrate 1. Then, cameras are aligned to aligning marks on the corresponding substrates, and the light-emitting element 4 is embedded in the organic insulating layer 3 by ODF bonding. Since the pressure of existing ODF equipment is fixed, the depth of the light-emitting element 4 pressed into the organic insulating layer 3 can be controlled by the thickness of the organic insulating layer 3.

Figure 3E:
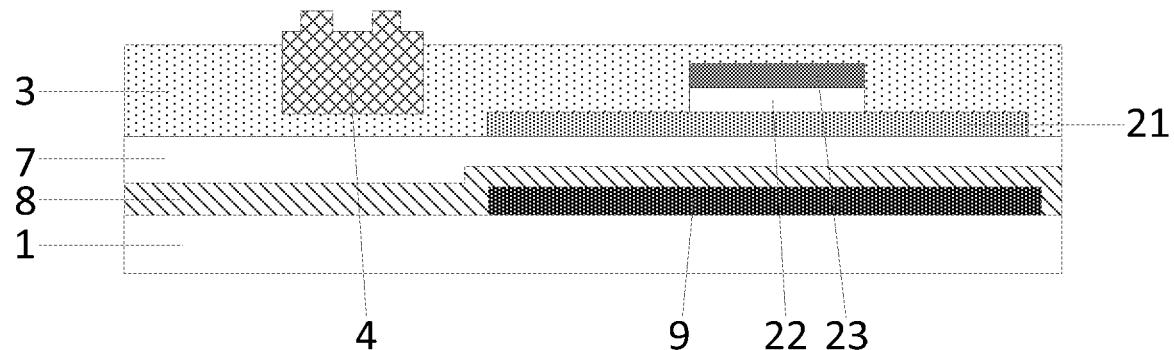
FIG. 3E is a fifth structural schematic diagram of a display panel after performing a preparation method of the display panel provided by an embodiment of the present application.

S205, peeling off the pyrolysis adhesives;
  in some embodiments, as shown in FIG. 3E, the organic insulating layer 3 may be cured in a $N_2$ or Ar atmosphere with the curing temperature being from 220° C. to 250° C., and the time being from 30 to 60 min. Compared with the pre-baking and pre-curing process in step S202, the curing (post-baking) temperature is higher and the time is longer, so that the cross-linking and curing reaction between the groups of the resin material is triggered to discharge gas reactants (such as outgas and $H_2O$), and finally a complete curing process is achieved. In addition, the pyrolysis adhesives 02 lose adhesion at a temperature ranging from 220° C. to 250° C., and is detached from the light-emitting element 4, so that the pyrolysis adhesives 02 and the box alignment substrate 01 are peeled off.

Figure 3F:
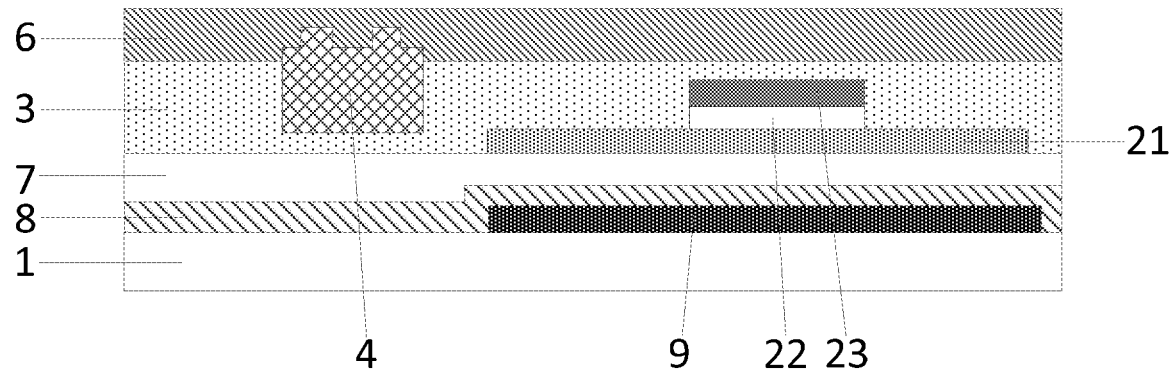
FIG. 3F is a sixth structural schematic diagram of a display panel after performing a preparation method of the display panel provided by an embodiment of the present application.
Figure 3G:
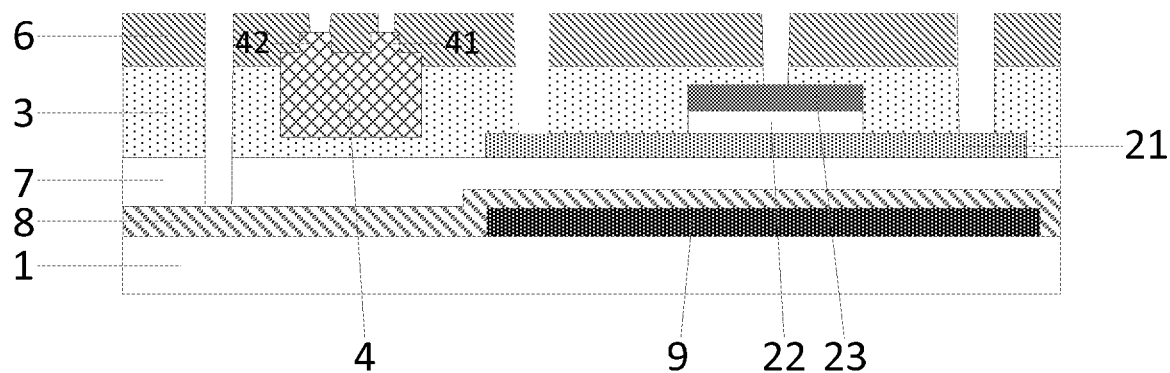
FIG. 3G is a seventh structural schematic diagram of a display panel after performing a preparation method of the display panel provided by an embodiment of the present application.
Figure 3H:
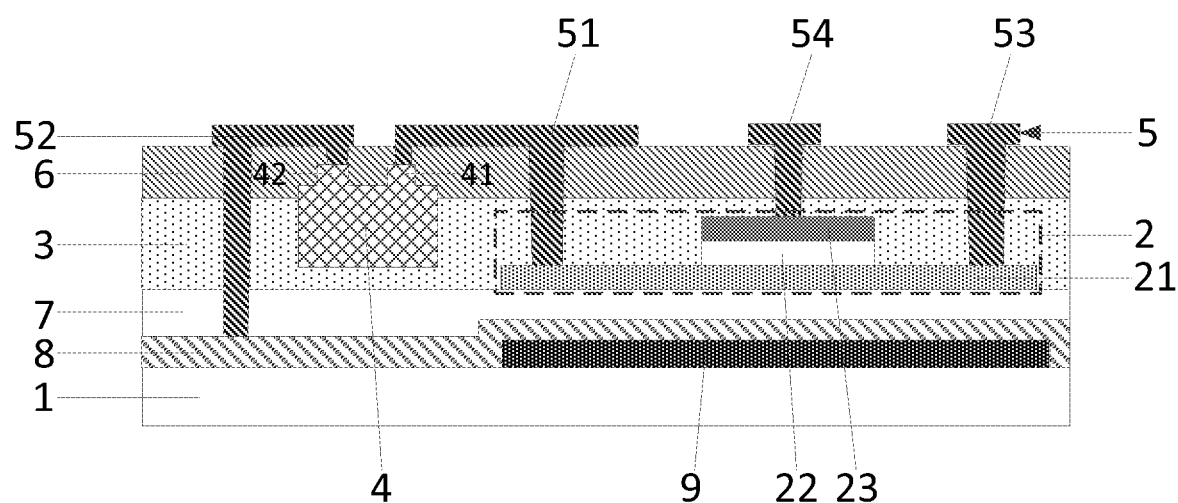
FIG. 3H is an eighth structural schematic diagram of a display panel after performing a preparation method of the display panel provided by an embodiment of the present application.

S206, forming a first lapping electrode on the side, facing away from the base substrate, of the light-emitting element; where the light-emitting element is electrically connected to the driving circuit through the first lapping electrode;
  in some embodiments, as shown in FIG. 3F, an interlayer insulating layer 6 is formed on the side, facing away from the base substrate 1, of the light-emitting element 4; as shown in FIG. 3G, the organic insulating layer 3 and the interlayer insulating layer 6 are patterned to expose the electrodes and prepare through holes for subsequent electrical connections; as shown in FIG. 3H, a source and drain metal layer 5 is formed on the side, facing away from the base substrate 1, of the interlayer insulating layer 6, in some embodiments, the source and drain metal layer 5 is deposited by a sputtering process, and the sputtering process is performed at a low temperature to avoid damage to the light-emitting element 4 caused by the high-temperature process. The source-drain metal layer 5 includes a first lapping electrode 51, a second lapping electrode 52, a third lapping electrode 53 and a fourth lapping electrode 54, the first electrode 41 of the light-emitting element 4 is electrically connected to an active layer 21 of the driving circuit 2 through the first lapping electrode 51, the second electrode 42 of the light-emitting element 4 is electrically connected to a common electrode layer 8 through the second lapping electrode 52, the third lapping electrode 53 is electrically connected to the active layer 21, and the fourth lapping electrode 54 is electrically connected to the gate 23; and as shown in FIG. 1, a passivation layer 10 is formed on the side, facing away from the base substrate 1, of the source and drain metal layer 5, and patterned to form a via hole, and a pixel electrode 13 is formed on the side, facing away from the base substrate 1, of the passivation layer 10, and electrically connected to the second lapping electrode 52 through the via hole.

In some embodiments, the light-emitting element 4 needs to be packaged after forming the display panel as shown in FIG. 1, namely a chip package structure needs to be arranged to protect the light-emitting element, and the packaging process is the same as that in the prior art and will not be described in detail herein.

According to the preparation method of the above-mentioned display panel provided by the embodiments of the present application, since the organic insulating layer is generally made of a resin material, the resin material can flow before being completely cured. Therefore, the resin material may be pre-cured to prevent it from flowing and to ensure that it has certain flexibility, then the light-emitting element can be embedded in the organic insulating layer by means of alignment bonding using the aligning device, and thus it is not necessary to adopt the eutectic welding technology in the prior art to transfer bare chip particles of the light-emitting element from an original substrate to a driving substrate. Therefore, the present application provides a simple, practical and economical light-emitting element mass transfer technology with high efficiency, yield and transfer precision. In addition, the light-emitting element is embedded in the organic insulating layer of the display panel, compared with the mode of welding the light-emitting element after a driving backplane is prepared, the thickness of the base substrate to a light-emitting element module part can be reduced in the present application.

In some embodiments, according to the above-mentioned preparation method provided in the embodiments of the present application, after forming the organic insulating layer in step S202, the method further includes: pre-curing the organic insulating layer with the pre-curing temperature being from 100° C. to 120° C., and a time being from 90 s to 150 s. Specific details may refer to the description process in step S202.

In some embodiments, according to the above-mentioned preparation method provided in the embodiments of the present application, step S205 of peeling off the pyrolysis adhesives may include:

curing the organic insulating layer with a curing temperature being from 220° C. to 250° C., and a time being from 30 min to 60 min; and leaving the pyrolysis adhesives to lose adhesion and detach from the light emitting element. Specific details may refer to the description process in step S205.

Figure 4:
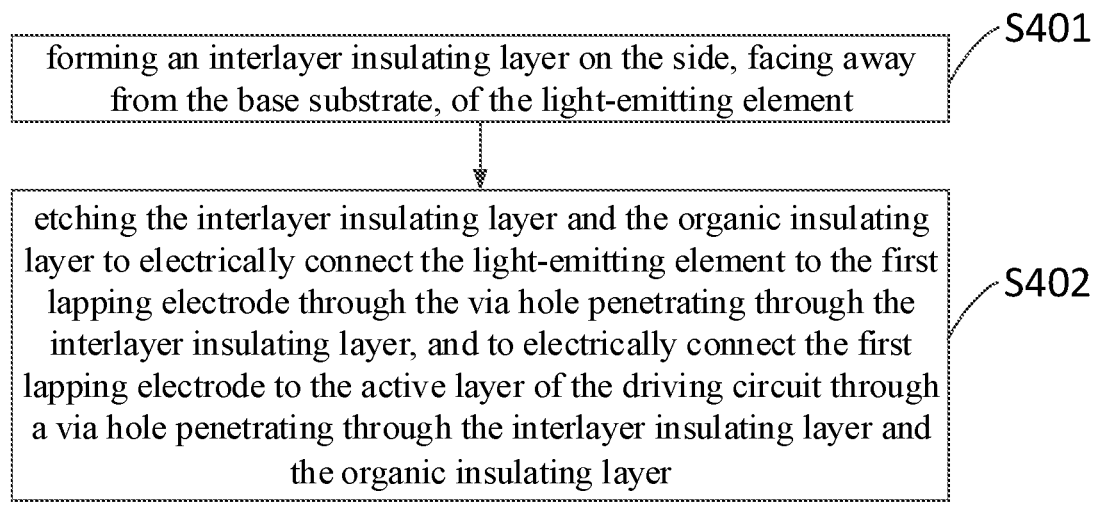
FIG. 4 is a second flow diagram of a preparation method of a display panel provided by an embodiment of the present application.

In some embodiments, according to the above-mentioned preparation method provided in the embodiments of the present application, before forming the first lapping electrode on the side, facing away from the base substrate, of the light-emitting element, as shown in FIG. 4, the method further includes:

S401, forming an interlayer insulating layer on the side, facing away from the base substrate, of the light-emitting element; and S402, etching the interlayer insulating layer and the organic insulating layer to electrically connect the light-emitting element to the first lapping electrode through the via hole penetrating through the interlayer insulating layer, and to electrically connect the first lapping electrode to the active layer of the driving circuit through a via hole penetrating through the interlayer insulating layer and the organic insulating layer.

In some embodiments, the detailed preparation process of the above steps S401 and S402 may refer to the description of the above step S206.

It should be noted that in the preparation method of the above-mentioned display panel provided in the embodiments of the present application, the patterning process may only include a photolithography process, or may include a photolithography process and an etching step, and may also include printing, inkjet and other processes for forming predetermined patterns. Photolithography process refers to the process which is used for forming patterns through photoresist, masks, exposure machines and the like and includes the technological procedures of film formation, exposure and development. In specific implementation, the corresponding patterning processes can be selected according to the structures formed in the present application.

Specifically, the above-mentioned display panel provided by the embodiments of the present application may be applied to a display device, and the display device may be any product or component with display function, such as a mobile phone, a tablet computer, a television, a display, a notebook computer, a digital photo frame and a navigator. Other indispensable components of the display device should be understood by those of ordinary skill in the art, will not be repeated herein, and should not be considered as a limitation on the present application. The implementation of the display device may refer to the embodiments of the above-mentioned display panel, and the repeated part is not described in detail herein.

The embodiments of the present application provide a display panel and a preparation method thereof. The display panel includes: a base substrate provided with a circuit area and a light-emitting area; a driving circuit located in the circuit area of the base substrate; an organic insulating layer covering the light-emitting area of the base substrate; a light-emitting element embedded in the organic insulating layer, where the orthographic projection of the light-emitting element on the base substrate and the orthographic projection of the driving circuit on the base substrate do not overlap; and a first lapping electrode located on the side, facing away from the base substrate, of the light-emitting element, where the light-emitting element is electrically connected with the driving circuit through the first lapping electrode. According to the display panel provided in the present application, since the organic insulating layer is generally made of a resin material, the resin material can flow before being completely cured, then the resin material may be pre-cured to prevent it from flowing and to ensure that it has certain flexibility, thus the light-emitting element can be embedded in the organic insulating layer by means of alignment bonding using aligning device. Therefore, it is not necessary to adopt the eutectic welding technology in the related technology to transfer bare chip particles of the light-emitting element from an original substrate to a driving substrate. Therefore, the present application provides a simple, practical and economical light-emitting element mass transfer technology with high efficiency, yield and transfer precision.

Obviously, those skilled in the art can make various changes and variations to the present application without departing from the spirit and scope of the present application. In this way, if these modifications and variations of the present application fall within the scope of the claims and equivalent technologies thereof of the present application, the present application is also intended to include these changes and variations.

What is claimed is:

1. A display panel, comprising:
   a base substrate provided with a circuit area and a light-emitting area;
   a driving circuit in the circuit area of the base substrate;
   an organic insulating layer covering the light-emitting area of the base substrate;
   a light-emitting element embedded in the organic insulating layer, wherein an overlap area between an orthographic projection of the light-emitting element on the base substrate and an orthographic projection of the driving circuit on the base substrate is 0, and the light-emitting element comprises a bottom surface facing the base substrate, a top surface facing away from the base substrate, and side surfaces between the bottom surface and the top surface; wherein the bottom surface and the side surfaces are in direct contact with the organic insulating layer, the light-emitting element is provided with a first electrode at a side, facing away from the base substrate, of the light-emitting element;
   a first lapping electrode on the side, facing away from the base substrate, of the light-emitting element, wherein the light-emitting element is electrically connected to the driving circuit through the first lapping electrode; and an interlayer insulating layer between a film layer in which the first lapping electrode is located and the light-emitting element, wherein the interlayer insulating layer is in direct contact with the top surface and is made of an inorganic material;

wherein the organic insulating layer further covers the circuit area; and the driving circuit comprises an active layer, a gate insulating layer and a gate sequentially stacked on the base substrate, and wherein the light-emitting element is electrically connected to the first lapping electrode through at least one first via hole penetrating through the interlayer insulating layer;

the first lapping electrode is electrically connected to the active layer through a second via hole penetrating through the interlayer insulating layer and the organic insulating layer;

a position at which the first electrode is electrically connected to the first lapping electrode is external to the organic insulating layer; and the organic insulating layer, which is in direct contact with the bottom surface and the side surfaces and through which the second via hole penetrates, is a continuously distributed single film made of a same organic material.

2. The display panel of claim 1, further comprising: a buffer layer located between the base substrate and the driving circuit, a common electrode layer located between the buffer layer and the base substrate, and a light-shielding metal layer located between the common electrode layer and the base substrate; and further comprising: a second lapping electrode arranged on the same layer as the first lapping electrode; wherein the light-emitting element is further provided with a second electrode at the side, facing away from the base substrate, of the light-emitting element, the first electrode is electrically connected to the first lapping electrode through one of the at least one first via hole penetrating through the interlayer insulating layer, the second electrode is electrically connected to the second lapping electrode through another one of the at least one first via hole penetrating through the interlayer insulating layer, and the second lapping electrode is electrically connected to the common electrode layer through a third via hole sequentially penetrating through the interlayer insulating layer, the organic insulating layer and the buffer layer.

3. The display panel of claim 2, further comprising:
a passivation layer located on a side, facing away from the base substrate, of the first lapping electrode, and
a pixel electrode located on a side, facing away from the base substrate, of the passivation layer, wherein the pixel electrode is electrically connected to the second lapping electrode through a fourth via hole penetrating through the passivation layer.

4. The display panel of claim 1, wherein a thickness of the organic insulating layer is greater than half of a thickness of the light-emitting element.

5. The display panel of claim 1, wherein the display panel comprises a plurality of light-emitting elements, and the plurality of light-emitting elements comprise a red light-emitting element, a green light-emitting element and a blue light-emitting element.

6. The display panel of claim 1, wherein the light-emitting element is pressed into and embedded in the organic insulating layer by bonding and embedding the light-emitting element into the organic insulating layer.

7. The display panel of claim 1, wherein a thickness of the organic insulating layer is 3 to 5 μm, a the thickness of the light-emitting element is 6 to 8 μm.

8. The display panel of claim 1, wherein the organic insulating layer is made of a silicon-based resin material or a photosensitive resin material.

9. A preparation method of the display panel of claim 1, comprising:
forming the driving circuit in the circuit area of the base substrate;
forming the organic insulating layer covering the light-emitting area on the base substrate;
adhering the light-emitting element to a box alignment substrate through pyrolysis adhesives;
aligning and bonding the box alignment substrate with the light-emitting element and the base substrate on which the organic insulating layer is formed through an aligning device, to embed the light-emitting element within the organic insulating layer; wherein the overlap area between the orthographic projection of the light-emitting element on the base substrate and the orthographic projection of the driving circuit on the base substrate is 0;
peeling off the pyrolysis adhesives; and
forming the first lapping electrode on the side, facing away from the base substrate, of the light-emitting element; wherein the light-emitting element is electrically connected to the driving circuit through the first lapping electrode.

10. The preparation method of claim 9, wherein after forming the organic insulating layer, the preparation method further comprises:
pre-curing the organic insulating layer with a pre-curing temperature being from 100° C. to 120° C., and a time being from 90s to 150s.

11. The preparation method of claim 9, wherein the peeling off the pyrolysis adhesives comprises:
curing the organic insulating layer with a curing temperature being from 220° C. to 250° C., and a time being from 30 min to 60 min; and
leaving the pyrolysis adhesives to lose adhesion and detach from the light emitting element.

12. The preparation method of claim 9, wherein the forming the driving circuit in the circuit area of the base substrate comprises:
forming an active layer, a gate insulating layer and a gate on the base substrate in a stacked mode sequentially; and
before forming the first lapping electrode on the side, facing away from the base substrate, of the light-emitting element, the method further comprises:
forming the interlayer insulating layer on the side, facing away from the base substrate, of the light-emitting element; and
etching the interlayer insulating layer and the organic insulating layer to electrically connect the light-emitting element to the first lapping electrode through at least one first via hole penetrating through the interlayer insulating layer, and to electrically connect the first lapping electrode to the active layer through a second via hole penetrating through the interlayer insulating layer and the organic insulating layer.

13. The preparation method of claim 12, wherein before forming the driving circuit in the circuit area of the base substrate, the method comprises: forming a light-shielding metal layer, a common electrode layer and a buffer layer on the base substrate in a stacked mode sequentially; and after forming the interlayer insulating layer on the side, facing away from the base substrate, of the light-emitting element, the method further comprises:

forming a second lapping electrode arranged on the same layer as the first lapping electrode on the side, facing away from the base substrate, of the light-emitting element; and etching the interlayer insulating layer and the organic insulating layer to electrically connect the light-emitting element to the second lapping electrode through another one of the at least one first via hole penetrating through the interlayer insulating layer, and to electrically connect the second lapping electrode to the common electrode layer through a third via hole sequentially penetrating through the interlayer insulating layer, the organic insulating layer and the buffer layer.

14. The preparation method of claim 13, further comprising:

forming a pixel electrode on a side, facing away from the base substrate, of the first lapping electrode;

wherein before forming the pixel electrode on the side, facing away from the base substrate, of the first lapping electrode, the method further comprises:

forming a passivation layer on the side, facing away from the base substrate, of the first lapping electrode, and patterning the passivation layer to form a fourth via hole penetrating through the passivation layer to electrically connect the pixel electrode to the second lapping electrode through the fourth via hole.

* * * * *